(12) United States Patent
Tian et al.

(10) Patent No.: US 11,935,621 B2
(45) Date of Patent: Mar. 19, 2024

(54) CALIBRATION CIRCUIT, MEMORY AND CALIBRATION METHOD

(71) Applicant: CHANGXIN MEMORY TECHNOLOGIES, INC., Hefei (CN)

(72) Inventors: Kai Tian, Hefei (CN); Yuxia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 328 days.

(21) Appl. No.: 17/448,051

(22) Filed: Sep. 19, 2021

(65) Prior Publication Data

US 2022/0130439 A1   Apr. 28, 2022

Related U.S. Application Data

(63) Continuation of application No. PCT/CN2021/105250, filed on Jul. 8, 2021.

(30) Foreign Application Priority Data

Oct. 28, 2020  (CN) .......................... 202011173755.3

(51) Int. Cl.
*H03K 5/156* (2006.01)
*G01R 31/317* (2006.01)
(Continued)

(52) U.S. Cl.
CPC ........ *G11C 7/222* (2013.01); *G01R 31/31727* (2013.01); *G11C 29/023* (2013.01); *H03K 5/135* (2013.01); *H03K 5/1565* (2013.01)

(58) Field of Classification Search
None
See application file for complete search history.

(56) References Cited

U.S. PATENT DOCUMENTS

| 6,838,919 B1 | 1/2005 | Kaviani |
| 7,015,739 B2 | 3/2006 | Lee |

(Continued)

FOREIGN PATENT DOCUMENTS

| CN | 1542861 A | 11/2004 |
| CN | 1675836 A | 9/2005 |

(Continued)

OTHER PUBLICATIONS

Yyons2019, "Ring Oscillator Layout Design", https://maxbook118.com/html/2019/0901/6153212200002101,shtm, Sep. 2, 2019.

(Continued)

*Primary Examiner* — Jeffrey S Zweizig
(74) *Attorney, Agent, or Firm* — Syncoda LLC; Feng Ma

(57) ABSTRACT

A calibration circuit includes: a differential input circuit, configured to receive first and second oscillation signals, the first and second oscillation signals having the same frequency and opposite phases, duty cycle of the first oscillation signal and duty cycle of the second oscillation signal being in a first preset range, and the differential input circuit being configured to output first and internal signals; a comparison unit, connected to an output end of the differential input circuit and configured to compare duty cycle of the first internal signal and/or duty cycle of the second internal signal; and a logical unit, connected to the comparison unit and the differential input circuit, and configured to control the differential input circuit according to an output result of the comparison unit, such that the duty cycle of the first internal signal and/or the duty cycle of the second internal signal reaches a second preset range.

16 Claims, 3 Drawing Sheets

(51) Int. Cl.
  *G11C 7/22* (2006.01)
  *G11C 29/02* (2006.01)
  *H03K 5/135* (2006.01)

(56) References Cited

U.S. PATENT DOCUMENTS

| | | | |
|---|---|---|---|
| 7,321,269 | B2 | 1/2008 | Drake |
| 7,501,870 | B2 | 3/2009 | Choi |
| 7,872,510 | B2 | 1/2011 | Lee |
| 8,106,697 | B2 | 1/2012 | Chang |
| 8,154,352 | B2 | 4/2012 | Ueno |
| 9,030,244 | B1 | 5/2015 | Luo |
| 9,252,753 | B2 | 2/2016 | Lin |
| 9,270,256 | B2 | 2/2016 | Lee |
| 9,667,252 | B1 | 5/2017 | Lee et al. |
| 9,985,619 | B2 * | 5/2018 | Lee .............. H03K 5/1565 |
| 9,998,125 | B2 | 6/2018 | Balamurugan et al. |
| 10,241,537 | B2 | 3/2019 | Li et al. |
| 10,249,354 | B1 | 4/2019 | Lee et al. |
| 10,270,429 | B1 | 4/2019 | Wang |
| 10,411,675 | B2 | 9/2019 | Kim et al. |
| 10,418,983 | B1 | 9/2019 | Lee |
| 10,458,857 | B2 | 10/2019 | Rachala et al. |
| 10,601,410 | B1 | 3/2020 | Satoh |
| 10,630,273 | B2 | 4/2020 | Tung et al. |
| 10,700,672 | B2 | 6/2020 | Savary et al. |
| 10,784,846 | B1 | 9/2020 | Bucossi |
| 10,826,476 | B1 | 11/2020 | Bucossi |
| 10,862,460 | B2 | 12/2020 | Kim et al. |
| 10,958,256 | B1 * | 3/2021 | Lin .............. H03K 5/1565 |
| 2002/0140477 | A1 | 10/2002 | Zhou |
| 2004/0032300 | A1 | 2/2004 | Joordens |
| 2004/0189364 | A1 | 9/2004 | Lee |
| 2005/0174156 | A1 | 8/2005 | Wu |
| 2007/0001724 | A1 | 1/2007 | Na |
| 2007/0018737 | A1 | 1/2007 | Drake |
| 2007/0046347 | A1 | 3/2007 | Lee |
| 2007/0090867 | A1 | 4/2007 | Kim |
| 2007/0241826 | A1 | 10/2007 | Ueno |
| 2007/0252629 | A1 | 11/2007 | Boerstler |
| 2008/0024182 | A1 | 1/2008 | Choi |
| 2008/0024233 | A1 | 1/2008 | Drake |
| 2008/0197903 | A1 | 8/2008 | Humble |
| 2008/0204094 | A1 | 8/2008 | Hur |
| 2009/0051443 | A1 | 2/2009 | Illegems |
| 2009/0115459 | A1 | 5/2009 | Kwon |
| 2009/0146700 | A1 | 6/2009 | Kim |
| 2009/0302912 | A1 | 12/2009 | Lee |
| 2012/0075025 | A1 | 3/2012 | Ueno |
| 2015/0171836 | A1 | 6/2015 | Lee |
| 2015/0372665 | A1 | 12/2015 | Tohidian et al. |
| 2016/0006420 | A1 | 1/2016 | Lin |
| 2016/0241249 | A1 | 8/2016 | Balamurugan et al. |
| 2017/0117887 | A1 | 4/2017 | Lee et al. |
| 2017/0179956 | A1 | 6/2017 | Lee et al. |
| 2017/0194947 | A1 | 7/2017 | Wei |
| 2018/0358954 | A1 | 12/2018 | Kim et al. |
| 2018/0364752 | A1 | 12/2018 | Li et al. |
| 2019/0190501 | A1 | 6/2019 | Wang et al. |
| 2019/0215146 | A1 | 7/2019 | Ke et al. |
| 2019/0237127 | A1 | 8/2019 | Moon et al. |
| 2019/0257696 | A1 | 8/2019 | Rachala et al. |
| 2019/0280682 | A1 | 9/2019 | Lee |
| 2019/0334508 | A1 | 10/2019 | Tang |
| 2019/0348971 | A1 | 11/2019 | Kim et al. |
| 2020/0052681 | A1 | 2/2020 | Tung et al. |
| 2020/0136599 | A1 | 4/2020 | Savary et al. |
| 2020/0160902 | A1 | 5/2020 | Gans |
| 2020/0162066 | A1 | 5/2020 | Gans |
| 2020/0177172 | A1 | 6/2020 | Satoh |
| 2020/0195240 | A1 | 6/2020 | Lim |
| 2020/0336135 | A1 | 10/2020 | Wang et al. |
| 2021/0036690 | A1 | 2/2021 | Tang |
| 2021/0218388 | A1 | 7/2021 | Wang et al. |
| 2022/0130439 | A1 | 4/2022 | Tian |

FOREIGN PATENT DOCUMENTS

| | | |
|---|---|---|
| CN | 1956329 A | 5/2007 |
| CN | 101141129 A | 3/2008 |
| CN | 101409541 A | 4/2009 |
| CN | 101629978 A | 1/2010 |
| CN | 103684365 A | 3/2014 |
| CN | 104270122 A | 1/2015 |
| CN | 104716929 A | 6/2015 |
| CN | 104734697 A | 6/2015 |
| CN | 105099445 A | 11/2015 |
| CN | 105281757 A | 1/2016 |
| CN | 205385473 U | 7/2016 |
| CN | 106374890 A | 2/2017 |
| CN | 106888007 A | 6/2017 |
| CN | 106941344 A | 7/2017 |
| CN | 105281757 B | 7/2018 |
| CN | 108768385 A | 11/2018 |
| CN | 110266294 A | 9/2019 |
| CN | 110830011 A | 2/2020 |
| CN | 111103530 A | 5/2020 |
| CN | 111147055 A | 5/2020 |
| JP | 2006333184 A | 12/2006 |
| JP | 2008011132 A | 1/2008 |
| JP | 2010035106 A | 2/2010 |
| JP | 2020009309 A | 1/2020 |
| JP | 2020149759 A | 9/2020 |
| KR | 20080009855 A | 1/2008 |
| KR | 100998677 B1 | 12/2010 |
| WO | 2011077573 A1 | 6/2011 |

OTHER PUBLICATIONS

Zhang Tao et al, "Design of Low Noise Single Ended CMOS Ring Voltage controlled Oscillators", Microelectronics and Computing vol. 7 vol. 21 ISSN: 1000-7180, Jul. 31, 2004, p. 164-167.

Elad Alon, "Schematic and Layout Simulation Exercise", http://bwrcs.eecs.berkeley.edu/Classes/icdesign/eel41_f12/CurrentLabs/Lab%204.pdf, Sep. 23, 2009.

Zhou Shengming, "Integrated Circuit Design and Implementation Technology Based on ZENI", Xidian University Press, Oct. 31, 2013, p. 169, Figures 8-50.

Supplementary European Search Report in the European application No. 21870566.3, dated Dec. 9, 2022.

Supplementary European Search Report in the European application No. 21856922.6, dated Nov. 2, 2022.

International Search Report in the international application No. PCT/CN2021/105207, dated Sep. 28, 2021.

International Search Report in the international application No. PCT/CN2021/112329, dated Oct. 29, 2021.

International Search Report in the international application No. PCT/CN2021/105250, dated Oct. 13, 2021.

International Search Report in the international application No. PCT/CN2021/106019, dated Oct. 20, 2021.

International Search Report in the international application No. PCT/CN2021/107942, dated Oct. 20, 2021.

International Search Report in the international application No. PCT/CN2021/118858, dated Dec. 2, 2021.

Supplementary European Search Report in the European application No. 21870482.3, dated Nov. 23, 2022.

Kyu-hyoun Kim et al., "A 20-GB/s 256-Mb DRAM with an inductorless Quadrature PLL and a Cascaded Pre-emphasis Transmitter", in IEEE Journal of Solid-State Circuits, vol. 41, No. 1, Jan. 2006, pp. 127-134.

Takashi Kusaga et al., "Four-State Ring Oscillator for Quadrature Signal Generation", ICSES 2008 International Conference on Singnals and Electronic Systems Krakow, Sep. 14-17, 2008, pp. 89-92.

First Office Action of the U.S. Appl. No. 17/448,891, dated Aug. 10, 2023. 55 pages.

First Office Action of the Japanese application No. 2022-545877, dated Oct. 3, 2023. 6 pages with English translation.

(56) References Cited

OTHER PUBLICATIONS

First Office Action of the Japanese application No. 2022-552390, dated Oct. 17, 2023. 9 pages with English translation.

* cited by examiner

CALIBRATION CIRCUIT, MEMORY AND CALIBRATION METHOD

CROSS-REFERENCE TO RELATED APPLICATIONS

This is a continuation of International Application No. PCT/CN2021/105250 filed on Jul. 8, 2021, which claims priority to Chinese Patent Application No. 202011173755.3 filed on Oct. 28, 2020. The disclosures of these applications are hereby incorporated by reference in their entirety.

BACKGROUND

A semiconductor memory is used in many electronic systems, so as to store retrievable data. As the demand for a faster electronic system, greater data capacity and less power consumption is growing, in order to meet changing needs, the semiconductor memory may need to be faster, store more data and use less power.

SUMMARY

Embodiments of the disclosure relate, but are not limited, to a calibration circuit, a memory and a calibration method.

Various embodiments of the disclosure provide a calibration circuit, which can include: a differential input circuit, configured to receive a first oscillation signal and a second oscillation signal, the first oscillation signal and the second oscillation signal having the same frequency and opposite phases, the duty cycle of the first oscillation signal and the duty cycle of the second oscillation signal being in a first preset range, and the differential input circuit configured to output a first internal signal and a second internal signal; a comparison unit, connected to an output end of the differential input circuit, and configured to compare the duty cycle of the first internal signal and/or the duty cycle of the second internal signal; and a logical unit, connected to the comparison unit and the differential input circuit, and configured to control the differential input circuit according to an output result of the comparison unit, such that the duty cycle of the first internal signal and/or the duty cycle of the second internal signal reaches a second preset range.

Various embodiments of the disclosure further provide a memory including a calibration circuit. The calibration circuit includes: a differential input circuit, configured to receive a first oscillation signal and a second oscillation signal, the first oscillation signal and the second oscillation signal having the same frequency and opposite phases, the duty cycle of the first oscillation signal and the duty cycle of the second oscillation signal being in a first preset range, and the differential input circuit configured to output a first internal signal and a second internal signal; a comparison unit, connected to an output end of the differential input circuit, and configured to compare the duty cycle of the first internal signal and/or the duty cycle of the second internal signal; and a logical unit, connected to the comparison unit and the differential input circuit, and configured to control the differential input circuit according to an output result of the comparison unit, such that the duty cycle of the first internal signal and/or the duty cycle of the second internal signal reaches a second preset range.

Various embodiments of the disclosure further provide a calibration method, which can include: receiving, with a differential input circuit, a first oscillation signal and a second oscillation signal, the first oscillation signal and the second oscillation signal having the same frequency and opposite phases, the duty cycle of the first oscillation signal and the duty cycle of the second oscillation signal being in a first preset range, and the differential input circuit outputting a first internal signal and a second internal signal; receiving, with a comparison unit, the first internal signal and the second internal signal, and comparing the duty cycle of the first internal signal or the duty cycle of the second internal signal; and controlling, with a logical unit, the differential input circuit according to an output result of the comparison unit, such that the duty cycle of the first internal signal and/or the duty cycle of the second internal signal reaches a second preset range.

BRIEF DESCRIPTION OF THE DRAWINGS

One or more embodiments are illustrated with figures in the corresponding drawings, and the exemplary descriptions do not constitute a limitation to the embodiments. Elements in the drawings having the same reference numerals are denoted by like elements, and unless otherwise stated, the figures in the drawings do not constitute a proportional limitation.

DETAILED DESCRIPTION

Figure 1:
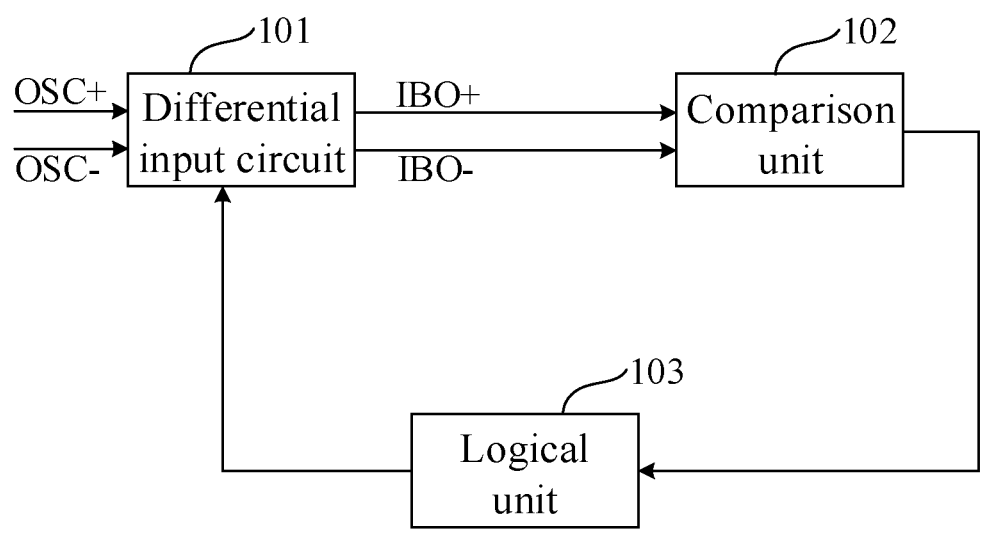
FIG. 1 is a functional block diagram of a calibration circuit according to an embodiment of the disclosure.

Semiconductor memory is typically controlled by providing commands, memory addresses and clocks to a memory, and furthermore, various commands, memory addresses and clocks may be provided by a memory controller. These three types of signals may control the memory to perform various storage operations, such as a read operation for reading data from the memory, and a write operation for storing data in the memory. Based on a known sequence related to a "related command" received by the memory, data is transferred between the memory and the memory controller. Specifically, a system clock configured to time the commands and the addresses may be provided to the memory, furthermore, a data clock may also be provided to the memory, and the data clock is used as a time sequence of reading data and a time sequence of writing data. Moreover, the memory may also provide a clock to the controller, as a time sequence for transmitting data to the controller. An external clock provided to the memory is configured to generate an internal clock, and the internal clock controls time sequences of various internal circuits during a memory operation of the memory. The time sequences of the internal circuits during operation of the memory are critical, furthermore, deviation of the internal clock may cause wrong operation. Deviation of the clock may include duty cycle distortion, that is, the duty cycle of a clock signal deviates from a preset duty cycle.

Therefore, the memory may need to have a Duty Cycle Adjust (DCA) function and a Duty Cycle Monitor (DCM) function, that is, the memory may include a DCA circuit and a DCM circuit. The DCA circuit may be configured to adjust the duty cycle of the internal clock generated by the external clock, and the DCM circuit may be configured to monitor whether the duty cycle of the clock deviates from the preset duty cycle or not.

As the working frequency of a memory is faster and faster at present, the demand for the duty cycle of an input signal is more and more strict, and it is very important to calibrate and monitor the duty cycle of the input signal by using a DCA function and a DCM function meeting requirement. Moreover, a differential input circuit that is configured to receive an external clock signal to generate an internal clock signal is in the memory, and the inherent circuit characteristics of the differential input circuit can cause the duty cycle deviation of the internal clock signal. If the influence of the differential input circuit on the duty cycle deviation is not detected and calibrated in time, the reading and writing performance of the memory will be affected.

In order to solve the above problems, the embodiments of the disclosure provide a calibration circuit, after a first oscillation signal and a second oscillation signal with duty cycles in a first preset range pass through the differential input circuit, a first internal signal and a second internal signal are output, and the first internal signal and the second internal signal can be used as actual input signals when the memory is tested. As a comparison unit detects the duty cycle of the first internal signal and the duty cycle of the second internal signal, and a logical unit controls the differential input circuit based on a detection result, the duty cycle of the first internal signal and the duty cycle of the second internal signal can be ensured to be steady and stabilized in a second preset range, and testing is executed by using the first internal signal and the second internal signal, such that the accuracy of a test result can be improved. Moreover, the calibration circuit also has a DCM function and a DCM function, and can calibrate the working state of the differential input circuit, such that the influence of the differential input circuit on duty cycle deviation is reduced, even avoided, and the reading and writing performance of the memory with the calibration circuit are improved.

In order to make the purposes, technical solutions and advantages of the embodiments of the disclosure clearer, the various embodiments of the disclosure are described in detail in combination with the drawings below. However, it can be understood by those of ordinary skill in the art that: in order to enable a reader to understand the disclosure better, many technical details are provided in the various embodiments of the disclosure. But, even if these technical details and a variety of change and modifications based on the various embodiments below do not exist, the technical solutions required to be protected by the disclosure may also be realized.

Figure 2:
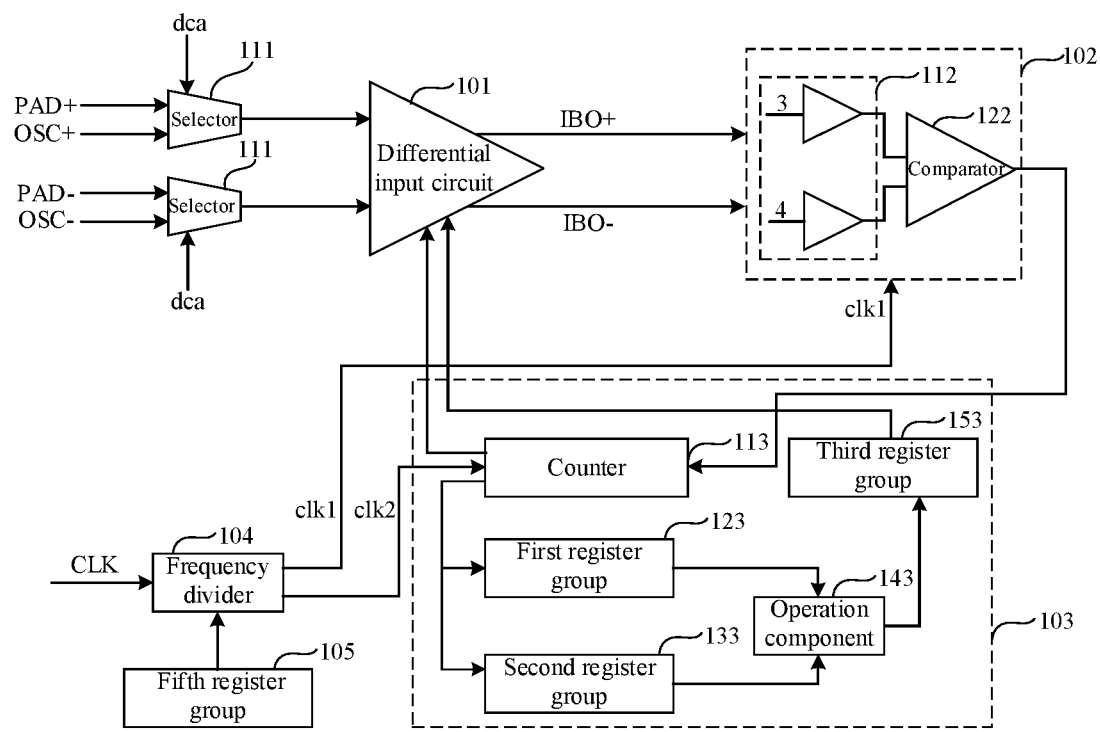
FIG. 2 is a schematic structural diagram of a calibration circuit according to an embodiment of the disclosure.

FIG. 1 is a functional block diagram of a calibration circuit according to an embodiment of the disclosure. FIG. 2 is a schematic structural diagram of a calibration circuit according to an embodiment of the disclosure.

Referring to FIG. 1 and FIG. 2, in the embodiment, the calibration circuit can include: a differential input circuit 101, configured to receive a first oscillation signal OSC+ and a second oscillation signal OSC−, the first oscillation signal OSC+ and the second oscillation signal OSC− having the same frequency and opposite phases, the duty cycle of the first oscillation signal OSC+ and the duty cycle of the second oscillation signal OSC− being in a first preset range, and the differential input circuit 101 configured to output a first internal signal IBO+ and a second internal signal IBO−; a comparison unit 102, connected to an output end of the differential input circuit 101, and configured to compare the duty cycle of the first internal signal IBO+ and the duty cycle of the second internal signal IBO−; and a logical unit 103, connected to the comparison unit 102 and the differential input circuit 101, configured to control the differential input circuit 101 according to an output result of the comparison unit 102, such that the duty cycle of the first internal signal IBO+ and/or the duty cycle of the second internal signal IBO− reaches a second preset range.

The calibration circuit can be built in the memory, can not only receive an external clock signal to generate an internal clock signal, but also receive the first oscillation signal and the second oscillation signal for testing to generate the first internal signal and the second internal signal, in addition, the duty cycle of the first internal signal and the duty cycle of the second internal signal can be stabilized in the second preset range, such that the accuracy of a test result of a test memory is improved. Moreover, the calibration circuit can also realize the DCA function and the DCM function of the memory, as well as the calibration function on the differential input circuit, and the duty cycle deviation problem of the differential input circuit on the clock signal is avoided.

The calibration circuit provided by the embodiment will be described in detail in combination with the drawings.

The first oscillation signal OSC+ and the second oscillation signal OSC− are differential clock signals, furthermore, the duty cycle of the first oscillation signal OSC+ and the duty cycle of the second oscillation signal OSC− are in the first preset range, that is, the first oscillation signal OSC+ and the second oscillation signal OSC− are high-quality signals. In an example, the first preset range can be 48%-52%.

Moreover, in the embodiment, the first oscillation signal OSC+ and the second oscillation signal OSC− can have high-frequency characteristics, that is, the frequency of the first oscillation signal OSC+ and the frequency of the second oscillation signal OSC− are equivalent to the frequency of the clock signal required for the memory to read and write, and the equivalence here can be either the same frequency or the frequency difference is within a test allowable range. For example, the frequency of the first oscillation signal OSC+ and the frequency of the second oscillation signal OSC− can reach 3.2 GHz or 4.8 GHz, even 6.4 GHz.

In addition, the first oscillation signal OSC+ and the second oscillation signal OSC− can be provided by an oscillation circuit built in the memory.

In the embodiment, the differential input circuit 101 can include an input buffer, configured to receive the differential first oscillation signal OSC+ and second oscillation signal OSC−, and output the differential first internal signal IBO+ and second internal signal IBO−.

Moreover, in the embodiment, the differential input circuit 101 can also be configured to receive a first external signal PAD+ and a second external signal PAD−, furthermore, the first external signal and the second external signal have the same frequency and opposite phases, that is, the first external signal PAD+ and the second external signal PAD− are also differential signals. Correspondingly, the calibration circuit can also include a selector 111. The first oscillation signal OSC+, the second oscillation signal OSC−, the first external signal PAD+ and the second external signal PAD− are connected to the differential input circuit 101 through the selector 111. By taking the first oscillation signal OSC+ and the second oscillation signal OSC− as a first differential pair signal and taking the first external signal PAD+ and the second external signal PAD− as a second differential pair signal, the selector 111 is configured to select one of the first differential pair signal and the second differential pair signal to input into the differential input circuit 101.

As the differential input circuit 101 has inherent circuit characteristics, even if the duty cycle of the first oscillation signal OSC+ and the duty cycle of the second oscillation signal OSC− meet requirements, the duty cycle of the first internal signal IBO+ and the duty cycle of the second internal signal IBO− obtained after being output through the differential input circuit 101 may deviate. Therefore, the comparison unit 102 is adopted to detect the duty cycle of the first internal signal IBO+ and the duty cycle of the second internal signal IBO−.

Because the first internal signal IBO+ and the second internal signal IBO− are differential signals, the sum of the duty cycle of the first internal signal IBO+ and the duty cycle of the second internal signal IBO− is 100%, and the comparison unit 102 is configured to detect the duty cycles of the differential first internal signal IBO+ and second internal signal IBO−. Specifically, the operation that the comparison unit 102 compares the duty cycle of the first internal signal IBO+ and/or the duty cycle of the second internal signal IBO− can include at least one of the following three conditions.

The comparison unit 102 compares the duty cycle of the first internal signal IBO+. Specifically, the comparison unit 102 compares whether the duty cycle of the first internal signal IBO+ reaches the second preset range or not, and the second preset range can be the same as the first preset range, for example, the second preset range can be 48%-52%. If the comparison unit 102 compares that the duty cycle of the first internal signal IBO+ is in the second preset range, it shows that the duty cycle of the second internal signal IBO− is also in the second preset range. If the comparison unit 102 compares that the duty cycle of the first internal signal IBO+ is not in the second preset range, it shows that the duty cycle of the second internal signal IBO− is also not in the second preset range.

The comparison unit 102 compares the duty cycle of the second internal signal IBO−. Specifically, the comparison unit 102 compares whether the duty cycle of the second internal signal IBO− reaches the second preset range or not, and the second preset range can be 48%-52%. If the comparison unit 102 compares that the duty cycle of the second internal signal IBO− is in the second preset range, it shows that the duty cycle of the first internal signal IBO+ is also in the second preset range. If the comparison unit 102 compares that the duty cycle of the second internal signal IBO− is not in the second preset range, it shows that the duty cycle of the first internal signal IBO+ is also not in the second preset range.

The comparison unit 102 compares the duty cycle of the first internal signal IBO+ and the duty cycle of the second internal signal IBO−. Specifically, the comparison unit 102 compares whether a difference value between the duty cycle of the first internal signal IBO+ and the duty cycle of the second internal signal IBO− is in a preset difference value range or not, and the preset difference value range can be −4%-4%. If the comparison unit 102 compares that the difference value is in the preset difference value range, it shows that the duty cycle of the first internal signal IBO+ and the duty cycle of the second internal signal IBO− are in the second preset range, otherwise, the duty cycle of the first internal signal IBO+ and the duty cycle of the second internal signal IBO− do not reach the second preset range.

It should be noted that, both the numerical ranges of the abovementioned second preset range and preset difference value range are exemplary descriptions. The embodiments do not limit the second preset range and the preset difference value range, and the second preset range and the preset difference value range can be reasonably set according to actual performance requirements of the memory.

In the embodiment, the comparison unit 102 can include: an integral unit 112 with a first input end 3 and a second input end 4, the first input end 3 receiving one of the first internal signal IBO+ or the second internal signal IBO−, and the second input end 4 receiving the other of the first internal signal IBO+ or the second internal signal IBO−; and a comparator 122, connected to an output end of the integral unit 112.

Specifically, the integral unit 112 can include two integral circuits, furthermore, the first input end 3 is used as an input end of one integral circuit, and the second input end 4 is used as an input end of the other integral circuit. The comparator 122 is configured to compare outputs of the two integral circuits and output high level or low level.

More specifically, the comparison unit 102 performs integral operation on the input first internal signal IBO+ and the second internal signal IBO− through the two integral circuits, furthermore, the result of the integral operation is input into the comparator 122, and the comparator 122 outputs a comparison result.

Taking the first internal signal IBO+ as a positive end (duty+) and the second internal signal IBO− as a negative end (duty−) as an example, in one example, if the output of the comparator 122 is at a high level, it shows that the duty cycle of the first internal signal IBO+ is greater than the duty cycle of the second internal signal IBO−; and if the output of the comparator 122 is at a low level, it shows that the duty cycle of the first internal signal IBO+ is less than the duty cycle of the second internal signal IBO−.

It should be noted that, the abovementioned corresponding relationship among the output results of the comparison unit 102, the duty cycle of the first internal signal IBO+ and the duty cycle of the second internal signal IBO− is merely exemplary; the embodiments do not limit the corresponding relationship among the high level, the low level, the duty cycle of the first internal signal IBO+ and the duty cycle of the second internal signal IBO−, as long as the corresponding relationship that different output results correspond to different duty cycles of the first internal signal IBO+ and different duty cycles of the second internal signal IBO− is guaranteed.

As shown in FIG. 2, the output result of the comparison unit 102 can be sampled and output through a sampling clock clk1. In the embodiment, the comparison unit 102 is driven by a sampling clock clk1, and the frequency of the sampling clock clk1 is lower than the frequency of the first internal signal IBO+ and/or the frequency of the second internal signal IBO−. The faster the frequency of the sampling clock clk1 is, the greater the sampling error is. The slower the frequency of the sampling clock clk1 is, the smaller the sampling error is, but the longer the test time is. Therefore, the optimal frequency of the sampling clock clk1 can be comprehensively selected according to the sampling error and the test time.

In the embodiment, a clock generation circuit can also include a frequency divider 104, configured to receive an external clock signal CLK, and generate the sampling clock clk1. The external clock signal CLK can be provided by a test machine or a memory.

Moreover, it can be seen from the foregoing analysis that, if the frequency of the sampling clock clk1 is adjustable, different frequencies of the sampling clock clk1 can be selected according to actual conditions, therefore, in the embodiment, the clock generation circuit can also include a fifth register group 105, connected with the frequency divider 104, and adapted to configure the frequency of the sampling clock. The fifth register group 105 can be a mode register.

As inherent characteristics of the comparison unit 102 can cause input deviation, in order to eliminate the error of the test result caused by the input deviation of the comparison unit 102, in the embodiment, the comparison unit 102 can also be configured to be that the first input end 3 and the second input end 4 are interchangeable. Specifically, the comparison unit 102 is configured below.

The first input end 3 of the integral unit 112 is configured to receive the first internal signal IBO+ when a flipping identification signal is at a low level, and is configured to receive the second internal signal IBO− when the flipping identification signal is at a high level. The second input end 4 of the integral unit 112 is configured to receive the second internal signal IBO− when the flipping identification signal is at a low level, and is configured to receive the first internal signal IBO+ when the flipping identification signal is at a high level. Herein, the mode register is in the memory, the flipping identification signal can be provided by the mode register, for example, in LPDDR4 or LPDDR5 or LPDDR6, the flipping identification signal can be defined as DCM MR OP[1], if the DCM MR OP[1] is 0, it shows that the flipping identification signal is at a low level, and if the DCM MR OP[1] is 1, it shows that the flipping identification signal is at a high level.

The logical unit 103 controls the differential input circuit 101 based on a detection result of the comparison unit 102, and adjusts circuit characteristics of the differential input circuit 101, such that the duty cycle of the first internal signal IBO+ and the duty cycle of the second internal signal IBO− output by the adjusted differential input circuit 101 reach the second preset range.

Specifically, the logical unit 103 can include: a counter 113, configured to adjust the duty cycle of the first internal signal IBO+ and/or the second internal signal IBO−; a first register group 123, configured to store the first value of the counter 113 according to the output of the comparator 122 when the flipping identification signal is at a low level; and a second register group 133, configured to store the second value of the counter 113 according to the output of the comparator 122 when the flipping identification signal is at a high level.

Specifically, the counter 113 has the functions of adjusting the circuit characteristics of the differential input circuit 101 and changing the duty cycle of the first internal signal IBO+ and the duty cycle of the second internal signal IBO−, and the duty cycle of the first internal signal IBO+ and the duty cycle of the second internal signal IBO− change monotonically, for example, the duty cycle changes from minimum to maximum or from maximum to minimum in one counting cycle. In one counting cycle, the output result of the comparator 122 will have only one inversion point, the value of the counter 113 corresponding to the inversion point is the setting where the duty cycle of the first internal signal IBO+ and the duty cycle of the second internal signal IBO− output by the differential input circuit 101 are the closest to the second preset range, and the value used as the value of the counter 113 is stored in the first register group 123 or the second register group 133.

More specifically, when the flipping identification signal is at a low level, the first value of the counter 113 is stored according to output of the comparator 122, and the first value is stored in the first register group 123. When the flipping identification signal is at a high level, the second value of the counter 113 is stored according to output of the comparator 122, and the second value is stored in the second register group 133. In order to conveniently understand this, the working principle of the logical unit 103 will be described in detail below.

When the flipping identification signal is at a low level, the first input end 3 of the integral unit 112 is configured to receive the first internal signal IBO+, and the second input end 4 is configured to receive the second internal signal IBO−; the counter 113 starts counting, for example, the counter 113 counts from 0 to 31 in one counting cycle, and meanwhile, the duty cycle of the first internal signal IBO+ and the duty cycle of the second internal signal IBO− output by the differential input circuit 101 also change from minimum to maximum (such as from 40% to 60%) or from maximum to minimum. Therefore, in one counting cycle (such as from 0 to 31), the comparator 122 will have only one inversion point, the value of the counter 113 corresponding to the inversion point is the first value, the first value is the setting where the duty cycle of the first internal signal IBO+ output by the differential input circuit 101 is the closest to the second preset range, for example, the first value can be that the duty cycle is the closest to 50%, and the first value is stored in the first register group 123.

When the flipping identification signal is at a high level, the first input end 3 of the integral unit 112 is configured to receive the second internal signal IBO−, the second input end 4 is configured to receive the first internal signal IBO+, that is, input ends of the comparison unit 102 are interchangeable, the counter 113 enters a new counting cycle, for example, the counter 113 counts from 0 to 31, and similarly, the second value of the counter 113 corresponding to the output inversion point of the comparator 122 is stored in the second register group 133.

It should be noted that, the abovementioned counting cycle from 0 to 31 is merely exemplary description, the counting type of the counter 113 is not limited in the embodiment, the counter 113 can be either an addition counter or a subtraction counter, which can be either a sequential increase or decrease count, or a step-by-step increase or decrease count, and monotonic change of the counter 113 in a single counting cycle is ensured.

The first input end 3 and the second input end 4 of the comparison unit 102 are interchangeable, in a manner of controlling the differential input circuit 101 through counting twice, the adverse effect caused by the input deviation of the comparison unit 102 itself can be eliminated, and the accuracy of the test result is further improved.

Moreover, the logical unit 103 can also include: an operation component 143, connected to the first register group 123 and the second register group 133, and configured to perform addition, subtraction, multiplication and division on output of the first register group 123 and the second register group 133; and a third register group 153, connected to the operation component 143, and configured to store an output result of the operation component 143.

Specifically, the output of the first register group 123 refers to the first value stored in the first register group 123, and the output of the second register group 133 refers to the second value stored in the second register group 133. In the embodiment, the operation component 143 adds the first value and the second value and divides them by 2 to obtain an average value, the average value is used as an output result of the operation component 143, and the average value is stored in the third register group 153. Because the average value already eliminates the input deviation of the comparison unit 102 itself, the average value is the setting where the duty cycle of the first internal signal IBO+ and the duty cycle of the second internal signal IBO− output by the differential input circuit 101 are the closest to the second preset range, for example, the duty cycle of the first internal signal IBO+ and the duty cycle of the second internal signal IBO− are the closest to 50%.

It should be understood that, the average value can be an integer rounded up by adding the first value and the second value divided by 2, or an integer rounded down by adding the first value and the second value divided by 2.

It should be noted that, in the embodiment, averaging of the first value and the second value is taken as an example, and in other embodiments, other operation modes can also be used to operate the first value and the second value.

The first register group 123, the second register group 133 and the third register group 153 can be mode registers.

In the embodiment, the comparison unit 113 is driven by a calculator clock, and the frequency of the calculator clock is lower than the frequency of the first internal signal IBO+ and/or the frequency of the second internal signal IBO−. The frequency of the calculator clock is adjustable, and the frequency of the calculator clock is reasonably selected according to the speed of adjusting the differential input circuit 101.

Moreover, the frequency of the sampling clock can be the same as the frequency of the calculator clock. The frequency divider can also be configured to receive an external clock signal, and generate the sampling clock and the calculator clock, and similarly, the fifth register group can also be adapted to configure the frequency of the calculator clock.

The value stored in the third register group 153 corresponds to the setting of the differential input circuit 101, and at this time, the duty cycle of the differential input circuit 101 is selectively switched from the counter 113 to the third register group 153, such that the differential input circuit fixedly outputs the first internal signal IBO+ and the second internal signal IBO− at an optimal duty cycle. It should be understood that, during a period that the differential input circuit 101 fixedly outputs the first internal signal IBO+ and the second internal signal IBO− at the optimal duty cycle, the comparison unit 102 can continuously compare the duty cycle of the first internal signal IBO+ and/or the duty cycle of the second internal signal IBO−. When the duty cycle of the first internal signal IBO+ and the duty cycle of the second internal signal IBO− depart from the preset range, the problem can be detected in time.

Moreover, in the embodiment, a control end of the selector 111 is configured to receive a calibration enable signal dca, when the calibration enable signal dca is at a low level, the first external signal PAD+ and the second external signal PAD− are input into the differential input circuit 101, while when the calibration enable signal dca is at a high level, the first oscillation signal OSC+ and the second oscillation signal OSC− are input into the differential input circuit 101.

When the calibration enable signal dca is at a high level, the calibration circuit enters a duty cycle calibration state, the first oscillation signal OSC+ and the second oscillation signal OSC− correspondingly having an initial duty cycle are input into the differential input circuit 101, so as to execute duty cycle calibration or duty cycle adjustment, thereby realizing the DCA function. When the calibration enable signal dca is at a low level, the calibration circuit quits the duty cycle calibration state, the first external signal PAD+ and the second external signal PAD− are input into the differential input circuit 101, so as to execute duty cycle detection or duty cycle monitoring, thereby realizing the DCM function.

According to the calibration circuit provided by the embodiment, through the differential input circuit 101, the comparison unit 102 and the logical unit 103, the stable first internal signal IBO+ and second internal signal IBO− can be generated in the memory, and the first internal signal IBO+ and the second internal signal IBO− meet the requirements of a high-frequency working signal of the memory. Therefore, the first internal signal IBO+ and the second internal signal IBO− can be used as test input signals for testing the memory, such that the memory can achieve a built-in self-testing function; There is no need to use an additional test machine to provide test input signals, and meanwhile, the problem that the test machine is difficult to provide a high-frequency test input signal is solved.

Meanwhile, the calibration circuit can also calibrate the differential input circuit 101, when the calibration circuit is used in the memory, the duty cycle deviation caused by the differential input circuit 101 itself can be reduced, such that the reading and writing operation performance of the memory is improved, for example, the noise allowance is improved, and the signal integrity is improved.

Moreover, in the embodiment, the comparison unit 102 detects output of the differential input circuit 101, furthermore, the logical unit 103 controls the differential input circuit 101 based on the output result of the comparison unit 102, such that the duty cycle of the first internal signal IBO+ and the duty cycle of the second internal signal IBO− can be stabilized in the second preset range. The adverse effect of duty cycle deviation on the test accuracy is avoided, and the test accuracy of testing the memory by utilizing the first internal signal IBO+ and the second internal signal IBO− is improved. For example, the duty cycle of the first internal signal IBO+ and the duty cycle of the second internal signal IBO− can be precisely controlled at 50%.

Meanwhile, the calibration circuit provided by the embodiment also has the DCM function and the DCA function.

Correspondingly, the embodiments of the disclosure further provide a memory, which can include the calibration circuit provided by the abovementioned embodiments. Specifically, the memory can be a Dynamic Random-Access Memory (DRAM), a Static Random-Access Memory (SRAM), a Magnetic Random-Access Memory (MRAM), a Ferroelectric Random-Access Memory (FeRAM), a Phase Change Random Access Memory (PCRAM), NAND, NOR, etc.

It can be seen from the above analysis that, high-speed first internal signals and second internal signals for testing can be generated in the memory, furthermore, the duty cycles of the first internal signals and second internal signals can be maintained in the second preset range, such that there is no need to use an additional test machine to provide test signals, and thus, the test accuracy of testing the memory is easily improved.

Figure 3:
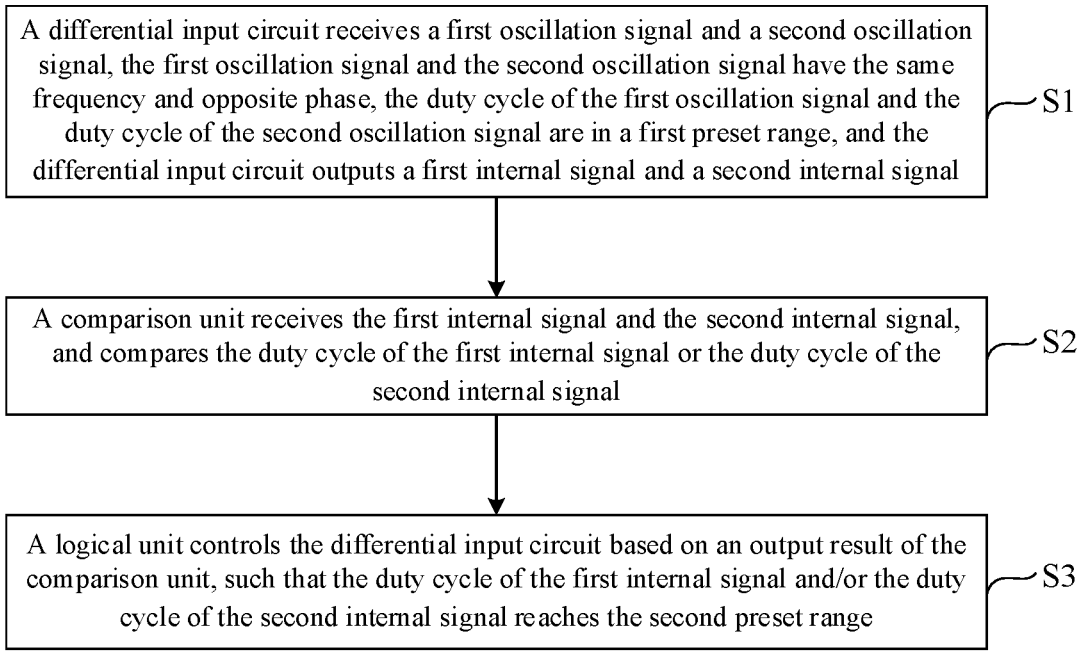
FIG. 3 is a schematic flowchart of a calibration method according to another embodiment of the disclosure.

Correspondingly, the embodiments of the disclosure further provide a calibration method. FIG. 3 is a schematic flowchart of a calibration method according to an embodiment of the disclosure. The calibration method in the embodiment of the disclosure will be described in detail in combination with the drawings. It should be noted that, the calibration method can be executed by utilizing the calibration circuit provided by the abovementioned embodiments.

Referring to FIG. 2 and FIG. 3, in the embodiment, the calibration method can include the following steps.

At S1, a differential input circuit receives a first oscillation signal OSC+ and a second oscillation signal OSC−, the first oscillation signal OSC+ and the second oscillation signal OSC− have the same frequency and opposite phases, the duty cycle of the first oscillation signal OSC+ and the duty cycle of the second oscillation signal OSC− are in a first preset range, and the differential input circuit outputs a first internal signal IBO+ and a second internal signal IBO−.

Specifically, the first oscillation signal OSC+ and the second oscillation signal OSC− are signals with a steady duty cycle, and for example, both the duty cycle of the first oscillation signal OSC+ and the duty cycle of the second oscillation signal OSC− are 50%.

At S2, a comparison unit receives the first internal signal IBO+ and the second internal signal IBO−, and compares the duty cycle of the first internal signal IBO+ or the duty cycle of the second internal signal IBO−.

The duty cycle of the first internal signal IBO+ and the duty cycle of the second internal signal IBO− output by the differential input circuit can be deviated, for example, the duty cycle of the first internal signal IBO+ becomes 40%, and the duty cycle of the second internal signal IBO− becomes 60%.

Specifically, when the flipping identification signal is at a low level, the comparison unit compares the duty cycle of the first internal signal IBO+, and when the flipping identification signal is at a high level, the comparison unit compares the duty cycle of the second internal signal IBO−.

The comparison unit can include: an integral unit with a first input end and a second input end, the first input end receiving one of the first internal signal IBO+ or the second internal signal IBO−, and the second input end receiving the other of the second internal signal IBO− or the first internal signal IBO+; and a comparator, connected to an output end of the integral unit.

When the flipping identification signal is at a low level, the first input end receives the first internal signal IBO+ and the second input end receives the second internal signal IBO−, and the comparator compares the duty cycle of the first internal signal IBO+ and has a corresponding output. The comparator compares the duty cycle of the first internal signal IBO+ with: the duty cycle of the second internal signal IBO−, or the preset duty cycle.

When the flipping identification signal is at a high level, the first input end receives the second internal signal IBO− and the second input end receives the first internal signal IBO+, and the comparator compares the duty cycle of the second internal signal IBO− and has a corresponding output. The comparator compares the duty cycle of the second internal signal IBO− with: the duty cycle of the first internal signal IBO+, or the preset duty cycle.

An output result of the comparison unit represents a difference value between the duty cycle of the first internal signal IBO+ and the duty cycle of the second internal signal IBO−. For example, if an output result of the comparison unit is at a high level, it shows that the duty cycle of the first internal signal IBO+ is greater than the duty cycle of the second internal signal IBO−; and if an output result of the comparison unit is at a low level, it shows that the duty cycle of the first internal signal IBO+ is less than the duty cycle of the second internal signal IBO−.

At S3, a logical unit controls the differential input circuit based on an output result of the comparison unit, such that the duty cycle of the first internal signal IBO+ and/or the duty cycle of the second internal signal IBO− reach the second preset range.

Specifically, the logical unit can include a counter, a first register group and a second register group. The differential input circuit is controlled through the counter, such that the duty cycle of the first internal signal IBO+ and the duty cycle of the second internal signal IBO− are adjusted.

When the flipping identification signal is at a low level, the counter counts from U to V, when the value of the counter is U, the duty cycle of the corresponding first internal signal IBO+ is X %, when the value of the counter is V, the duty cycle of the corresponding first internal signal IBO+ is Y %, and when the output result of the comparison unit is changed from the low level to the high level, the value of the counter corresponding to the counter at this time is stored in the first register group. For example, U can be 0, V can be 7, X can be 40, and Y can be 60%.

When the flipping identification signal is at a high level, the counter counts from U to V, when the value of the counter is U, the duty cycle of the corresponding second internal signal IBO− is Y %, when the value of the counter is V, the duty cycle of the corresponding second internal signal IBO− is X %, when the output result of the comparison unit is changed from the high level to the low level, the value of the counter corresponding to the counter at this time is stored in the second register group. For example, U can be 0, V can be 7, X can be 40, and Y can be 60%.

Specifically, for example, when the flipping identification signal is at a low level, the first input end receives the first internal signal IBO+ and the second input end receives the second internal signal IBO−, and the counter counts from 0 to 7 in one counting cycle. When the output result of the comparison unit is at a low level, it shows that the duty cycle of the first internal signal IBO+ is less than the duty cycle of the second internal signal IBO−; and when the output result of the comparison unit is at a high level, it shows that the duty cycle of the first internal signal IBO+ is greater than the duty cycle of the second internal signal IBO−. Therefore, the output result of the comparison unit jumps from the low level to the high level, corresponding to an inversion point, for example, the value of the counter at this time is 3, and the counter value 3 of the counter corresponding to the inversion point used as the first value is stored in the first register group.

For example, when the flipping identification signal is at a high level, the first input end receives the second internal signal IBO− and the second input end receives the first internal signal IBO+, and the counter counts from 0 to 7 in one counting cycle. When the output result of the comparison unit is at a high level, it shows that the duty cycle of the first internal signal IBO+ is less than the duty cycle of the second internal signal IBO−; and when the output result of the comparison unit is at a low level, it shows that the duty cycle of the first internal signal IBO+ is greater than the duty cycle of the second internal signal IBO−. Therefore, the output result of the comparison unit jumps from the high level to the low level, corresponding to an inversion point, for example, the value of the counter at this time is 4, and the counter value 4 of the counter corresponding to the inversion point used as the second value is stored in the second register group.

It should be noted that, when the flipping identification signal is at a low level, the counter counts from 0 to 7, the duty cycle of the first internal signal IBO+ changes monotonically, for example, the duty cycle of the first internal signal IBO+ can be in preset step-by-step increasing, and if the counter value of the counter increases by 1, the duty cycle of the first internal signal IBO+ increases by ((60−40)/8)%. It should be noted that, when the flipping identification signal is at a high level and the counter counts from 0 to 7, the duty cycle of the second internal signal IBO− changes monotonically. For example, the duty cycle of the first internal signal IBO+ can present a preset stepwise increase, and if the counter value of the counter increases by 1, the duty cycle of the first internal signal IBO+ increases by ((60−40)/8)%.

The logical unit can also include an operation component and a third register group, the operation component performs addition, subtraction, multiplication and division on output of the first register group and the second register group, and stores the obtained numerical value H in the third register group, herein, H is a positive integer, and H is greater than or equal to U and less than or equal to V.

In the embodiments, the numerical value H is the sum of the first value and the second value divided by 2, that is, the numerical value H is the average of the first value and the second value, the numerical value H is the setting corresponding to the first internal signal IBO+ and the second internal signal IBO− reaching the second preset range, for example, H is equal to (3+4)/2, that is, H is equal to 3.5, and H can also be rounded up to 3 or down to 4. That is, the duty cycle of the second internal signal IBO+ corresponding to the numerical value H is in the second preset range, and the second preset range can be 48%-52%, such as 50%.

After the numerical value H is obtained, the differential input circuit is no longer controlled by the counter, but the numerical value H is used as the setting of the differential input circuit, such that the differential input circuit outputs the first internal signal IBO+ with a preset duty cycle, and the corresponding second internal signal IBO− is also a signal whose duty cycle meets the requirements.

The solution of the calibration method provided in the embodiment can generate the first internal signal IBO+ and the second internal signal IBO− with high speed and high quality, the first internal signal IBO+ and the second internal signal IBO− are clock signals with stable duty cycles, and the first internal signal IBO+ and the second internal signal IBO− can be used as clock signals required for reading and writing operations of the memory. Moreover, the calibration method can also calibrate the differential input circuit, timely detect the influence of the differential input circuit on the duty cycle, and ensure that the duty cycle of the first internal signal IBO+ and the duty cycle of the second internal signal IBO− output through the differential input circuit reach the second preset range. For example, referring to FIG. 2 and FIG. 3, through the calibration method provided by the embodiment, the duty cycle of the first internal signal IBO+ is adjusted from 40% to 50%, and the duty cycle of the second internal signal IBO− is adjusted from 60% to 50%. Therefore, the deviation on the clock duty cycle caused by the differential input circuit 101 is eliminated.

It can be understood by those of ordinary skill in the art that, the above various implementation modes are specific embodiments for realizing the disclosure, in actual application, various changes on the embodiments can be made in form and detail, and the spirit and the scope of the disclosure are not deviated. Those skilled in the art can implement respective variations and modifications without departing from the spirit and scope of the disclosure, and thus the scope of protection of the disclosure should be subject to the scope defined by the claims.

According to some embodiments of the disclosure, a calibration circuit can include: a differential input circuit, configured to receive a first oscillation signal and a second oscillation signal, the first oscillation signal and the second oscillation signal having the same frequency and opposite phases, the duty cycle of the first oscillation signal and the duty cycle of the second oscillation signal being in a first preset range, and the differential input circuit being configured to output a first internal signal and a second internal signal; a comparison unit, connected to an output end of the differential input circuit, and configured to compare the duty cycle of the first internal signal and/or the duty cycle of the second internal signal; and a logical unit, connected to the comparison unit and the differential input circuit, and configured to control the differential input circuit according to an output result of the comparison unit, such that the duty cycle of the first internal signal and/or the duty cycle of the second internal signal reaches a second preset range. In this way, the calibration circuit provided by the embodiment of the disclosure can not only generate a differential internal signal based on the first oscillation signal and the second oscillation signal, but also has the DCM function and the DCA function to ensure that the duty cycle of the first internal signal and the duty cycle of the second internal signal generated by the calibration circuit are stable in the second preset range; correspondingly, when the first internal signal and the second internal signal are used to test the memory, it is conducive to avoid the problem of test deviation caused by the duty cycle deviation of the input signal, improve the test accuracy of the memory, and enable the memory to realize the DCM function and the DCA function.

What is claimed is:

1. A calibration circuit, comprising:
   a differential input circuit, configured to receive a first oscillation signal and a second oscillation signal, the first oscillation signal and the second oscillation signal having a same frequency and opposite phases, a duty cycle of the first oscillation signal and a duty cycle of the second oscillation signal being in a first preset range, and the differential input circuit configured to output a first internal signal and a second internal signal;
   a comparison unit, connected to an output end of the differential input circuit, and configured to compare the duty cycle of the first internal signal and/or the duty cycle of the second internal signal; and
   a logical unit, connected to the comparison unit and the differential input circuit, and configured to control the differential input circuit according to an output result of the comparison unit, such that the duty cycle of the first internal signal and/or the duty cycle of the second internal signal reaches a second preset range,
   wherein the comparison unit comprises:
   an integral unit with a first input end and a second input end, the first input end configured to receive one of the first internal signal or the second internal signal, and the second input end configured to receive another of the second internal signal or the first internal signal; and
   a comparator, connected to an output end of the integral unit,
   wherein the first input end of the integral unit is configured to receive the first internal signal when a flipping identification signal is at a low level, and receive the second internal signal when the flipping identification signal is at a high level; and
   the second input end of the integral unit is configured to receive the second internal signal when the flipping identification signal is at a low level, and receive the first internal signal when the flipping identification signal is at a high level.

2. The calibration circuit of claim 1, wherein the logical unit comprises:

a counter, configured to adjust the duty cycle of the first internal signal and/or the duty cycle of the second internal signal;

a first register group, configured to store a first value of the counter according to output of the comparator when the flipping identification signal is at a low level; and a second register group, configured to store a second value of the counter according to output of the comparator when the flipping identification signal is at a high level.

3. The calibration circuit of claim 2, wherein the logical unit further comprises:

an operation component, connected to the first register group and the second register group, and configured to perform addition, subtraction, multiplication and division on output of the first register group and the second register group; and a third register group, connected to the operation component, and configured to store an output result of the operation component.

4. The calibration circuit of claim 3, wherein the comparison unit is driven by a sampling clock, and a frequency of the sampling clock is lower than a frequency of the first internal signal and/or a frequency of the second internal signal.

5. The calibration circuit of claim 4, wherein the counter is driven by a calculator clock, and a frequency of the calculator clock is lower than the frequency of the first internal signal and/or the frequency of the second internal signal.

6. The calibration circuit of claim 5, wherein the frequency of the sampling clock is same as the frequency of the calculator clock.

7. The calibration circuit of claim 6, further comprising:

a frequency divider, configured to receive an external clock signal, and generate the sampling clock and the calculator clock.

8. The calibration circuit of claim 7, further comprising:

a fifth register group, connected with the frequency divider, and adapted to configure the frequency of the sampling clock and the frequency of the calculator clock.

9. The calibration circuit of claim 1, wherein the differential input circuit is further configured to receive a first external signal and a second external signal, and the first external signal and the second external signal have a same frequency and opposite phases.

10. The calibration circuit of claim 9, further comprising:

a selector, wherein the first oscillation signal, the second oscillation signal, the first external signal and the second external signal are connected to the differential input circuit through the selector, and by taking the first oscillation signal and the second oscillation signal as a first differential pair signal and taking the first external signal and the second external signal as a second differential pair signal, the selector is configured to select one of the first differential pair signal and the second differential pair signal to input into the differential input circuit.

11. The calibration circuit of claim 10, wherein a control end of the selector is configured to receive a calibration enable signal, when the calibration enable signal is at a low level, the first external signal and the second external signal are input into the differential input circuit, and when the calibration enable signal is at a high level, the first oscillation signal and the second oscillation signal are input into the differential input circuit.

12. A memory, comprising a calibration circuit, wherein the calibration circuit comprises:

a differential input circuit, configured to receive a first oscillation signal and a second oscillation signal, the first oscillation signal and the second oscillation signal having a same frequency and opposite phases, a duty cycle of the first oscillation signal and a duty cycle of the second oscillation signal being in a first preset range, and the differential input circuit configured to output a first internal signal and a second internal signal;

a comparison unit, connected to an output end of the differential input circuit, and configured to compare the duty cycle of the first internal signal and/or the duty cycle of the second internal signal; and a logical unit, connected to the comparison unit and the differential input circuit, and configured to control the differential input circuit according to an output result of the comparison unit, such that the duty cycle of the first internal signal and/or the duty cycle of the second internal signal reaches a second preset range, wherein the differential input circuit is further configured to receive a first external signal and a second external signal, and the first external signal and the second external signal have a same frequency and opposite phases.

13. A calibration method, comprising:

receiving, with a differential input circuit, a first oscillation signal and a second oscillation signal, the first oscillation signal and the second oscillation signal having the same frequency and opposite phases, the duty cycle of the first oscillation signal and the duty cycle of the second oscillation signal being in a first preset range, and the differential input circuit outputting a first internal signal and a second internal signal;

receiving, with a comparison unit, the first internal signal and the second internal signal, and comparing the duty cycle of the first internal signal or the duty cycle of the second internal signal; and controlling, with a logical unit, the differential input circuit according to an output result of the comparison unit, such that the duty cycle of the first internal signal and/or the duty cycle of the second internal signal reaches a second preset range, wherein the receiving, with the comparison unit, the first internal signal and the second internal signal comprises:

when a flipping identification signal is at a low level, the comparison unit comparing the duty cycle of the first internal signal; and when the flipping identification signal is at a high level, the comparison unit comparing the duty cycle of the second internal signal.

14. The calibration method of claim 13, wherein the controlling, with the logical unit, the differential input circuit according to the output result of the comparison unit comprises:

the logical unit comprising a counter, a first register group and a second register group;

when the flipping identification signal is at a low level, the counter counting from U to V, when the value of the counter is U, the duty cycle corresponding to the first internal signal being X%, when the value of the counter is V, the duty cycle corresponding to the first internal signal being Y%, and when the output result of the comparison unit is changed from the low level to the high level, the counter value corresponding to the counter at this time being stored in the first register group;

when the flipping identification signal is at a high level, the counter counting from U to V, when the value of the counter is U, the duty cycle corresponding to the second internal signal being Y%, when the value of the counter is V, the duty cycle corresponding to the second oscillation signal being X%, when the output result of the comparison unit is changed from the high level to the low level, the counter value corresponding to the counter at this time being stored in the second register group;

wherein both the U and V are integers, the U is less than V, both the X and Y are positive integers, the X is less than 50, and the Y is greater than 50.

15. The calibration method of claim 14, wherein the controlling, with the logical unit, the differential input circuit according to the output result of the comparison unit further comprises:

the logical unit further comprising an operation component and a third register group;

the operation component performing addition, subtraction, multiplication and division on output of the first register group and the second register group, and storing the obtained numerical value H in the third register group;

wherein the H is an integer, and the H is greater than or equal to the U and less than or equal to the V.

16. The calibration method of claim 15, wherein the duty cycle of the first internal signal corresponding to the H is in the second preset range.

* * * * *